(12) United States Patent
Kim et al.

(10) Patent No.: US 10,770,430 B1
(45) Date of Patent: Sep. 8, 2020

(54) PACKAGE INTEGRATION FOR MEMORY DEVICES

(71) Applicant: Xilinx, Inc., San Jose, CA (US)

(72) Inventors: Myongseob Kim, Pleasanton, CA (US); Henley Liu, San Jose, CA (US); Cheang-Whang Chang, Mountain View, CA (US); Jaspreet Singh Gandhi, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/361,617

(22) Filed: Mar. 22, 2019

(51) Int. Cl.
*H01L 25/065* (2006.01)
*H01L 25/18* (2006.01)
*H01L 25/00* (2006.01)

(52) U.S. Cl.
CPC .......... *H01L 25/0652* (2013.01); *H01L 25/18* (2013.01); *H01L 25/50* (2013.01); *H01L 2225/06513* (2013.01); *H01L 2225/06517* (2013.01); *H01L 2225/06555* (2013.01); *H01L 2225/06586* (2013.01); *H01L 2225/06589* (2013.01)

(58) Field of Classification Search
CPC ..... H01L 25/0652; H01L 25/18; H01L 25/50; H01L 2225/06555
See application file for complete search history.

(56) References Cited

U.S. PATENT DOCUMENTS

| | | | |
|---|---|---|---|
| 8,378,480 B2 | 2/2013 | Chen et al. | |
| 2016/0064358 A1* | 3/2016 | Usami | H01L 24/97 257/737 |
| 2016/0322330 A1 | 11/2016 | Lin et al. | |
| 2017/0250161 A1* | 8/2017 | Haba | H01L 22/20 |
| 2019/0067152 A1* | 2/2019 | Wuu | H01L 23/367 |
| 2019/0237412 A1* | 8/2019 | Lee | H01L 23/5386 |
| 2019/0355637 A1* | 11/2019 | Chen | H01L 23/367 |

* cited by examiner

*Primary Examiner* — Allan R Wilson
(74) *Attorney, Agent, or Firm* — Patterson + Sheridan, LLP

(57) ABSTRACT

An electronic device and method for fabricating the same are disclosed herein. In one example the electronic device includes a substrate, a first die stack, and a second die stack. The first die stack includes a first functional die and a first dummy die. The first functional die is mounted to the substrate. The second stack includes a plurality of serially stacked second functional dies mounted to the substrate. The first dummy die is stacked on the first functional die. The first dummy die has a top surface that is substantially coplanar with a top surface of the second die stack. In one particular example, the first die stack includes a logic die and the second die stack includes a plurality of serially stacked memory dies.

20 Claims, 9 Drawing Sheets

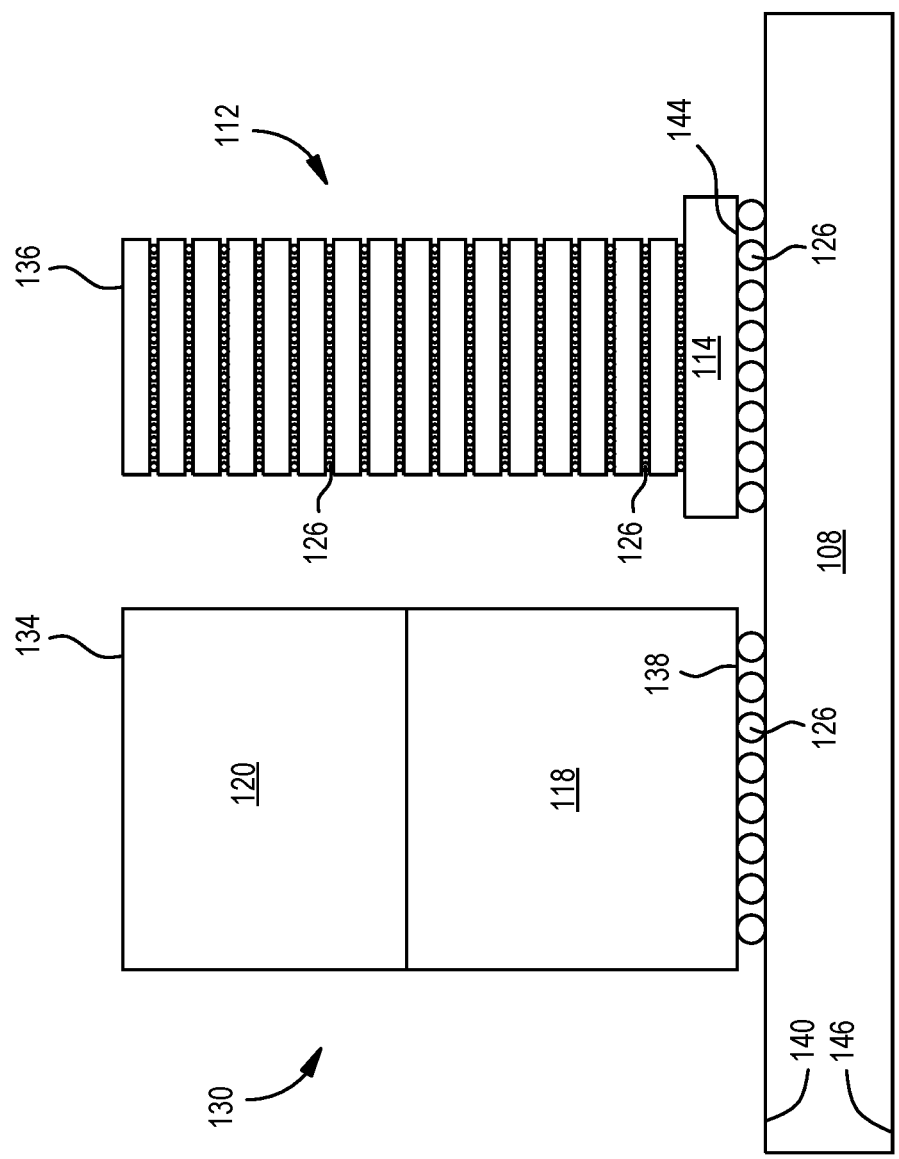

US 10,770,430 B1

PACKAGE INTEGRATION FOR MEMORY DEVICES

TECHNICAL FIELD

Embodiments of the present disclosure generally relate to chip packages and electronic devices having the same. In particular, to chip packages that included include at least one stacked dummy die, and methods for fabricating the same.

BACKGROUND ART

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packages include one or more stacked components such as integrated circuit (IC) dies, through-silicon-via (TSV) interposer, and a package substrate, with the chip package itself stacked on a printed circuit board (PCB). The IC dies may include memory, logic, MEMS, RF or other IC device.

In many chip packages, providing adequate thermal management has become increasingly challenging. Failure to provide adequate cooling often results in diminished service life and even device failure. Thermal management is particularly problematic in applications where high bandwidth memory (HBM) stacks and logic die, such as field programmable gate arrays (FPGA), are integrated in a single package. In such applications, the height differential between the HBM stack and logic die may result in inefficient cooling due to excessive use of thermal interface material or overmolding to compensate for the height mismatch. Failure to adequately regulate the temperature of the chip package may also result in diminished performance, device failure or system shutdowns. Furthermore, a large height differential between the HBM stack and logic die also creates a variety of assembly and factory automation problems, which undesirably contribute to poor production yields and longer, and thus more costly, fabrication times.

Therefore, a need exists for an improved chip package for co-packaged logic and memory applications.

SUMMARY

An electronic device and method for fabricating the same are disclosed herein. In one example, the electronic device includes a substrate, a first die stack, and a second die stack. The first die stack includes a first functional die and a first dummy die. The first functional die is mounted to the substrate. The second die stack includes a plurality of serially stacked second functional dies that are mounted to the substrate. The first dummy die is stacked on the first functional die. The first dummy die has a top surface that is substantially coplanar with a top surface of the second die stack. In one particular example, the first die stack includes a logic die and the second die stack includes a plurality of serially stacked memory dies.

In another example, electronic memory device includes an interposer substrate mounted on a package substrate, a logic stack mounted on a top surface of the interposer substrate, a memory stack disposed on the top surface the interposer substrate. The logic stack includes one or more dummy dies stacked on a logic die. The memory stack includes a plurality of serially stacked memory dies. At least one of the one or more dummy dies is thinned. The logic stack has a top surface that is substantially coplanar with a top surface of the memory stack.

In another example, a method for forming a memory device is provided that includes mounting memory stack to a substrate, mounting a logic stack to the substrate, and thinning the logic stack to a height substantially the same a height of the memory stack. The memory stack includes a plurality of serially stacked memory dies disposed in a logic die. The logic stack includes a first dummy die disposed on a logic die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2-7 are schematic sectional views of different examples of an integrated circuit chip package during different stages of fabrication.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 1A:
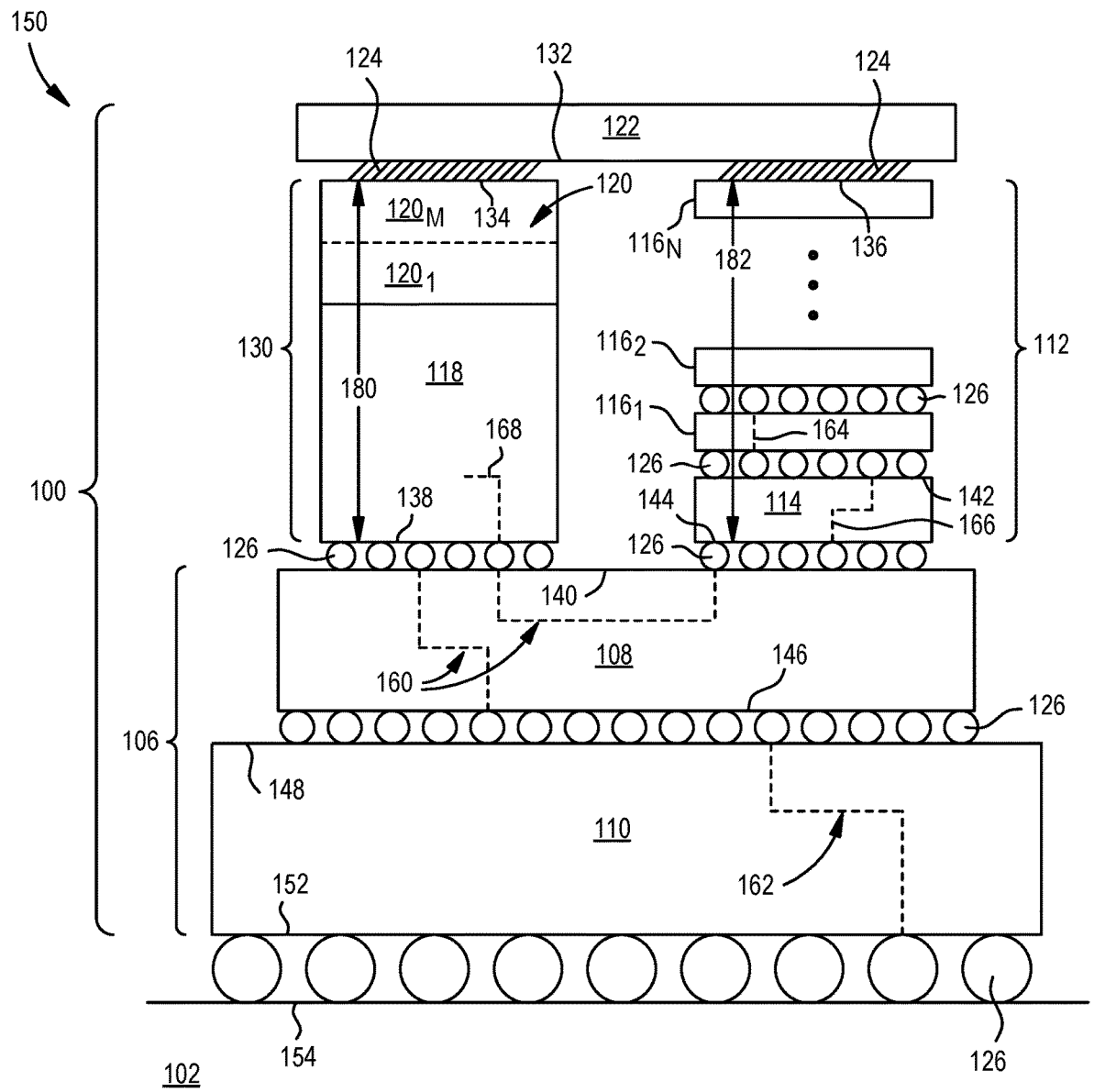
FIG. 1A is a schematic front view of an integrated circuit chip package mounted on a printed circuit board.

Examples described herein generally provide chip packages and methods of fabricating chip packages. The chip package includes first die stack that has a dummy die stacked with one more functional dies. The functional die may be a logic die, memory die, or other functional die. The dummy die is utilized to reduce or even eliminate a height differential between a second die stack and the first die stack that are co-packaged into an electronic device. The second die stack may also include a plurality of functional dies. Some exemplary electronic devices include multichip modules (MCM), system-in-packages (SiP), system-on-chip (SoC), InFO packages, chip-on-wafer-on-substrate (CoWoS), 2D packages, 2.5D packages, and 3D packages, among others. The dies comprising the first dies stack may be heterogeneous or homogeneous in functionality. Similarly, the dies comprising the second stack may be heterogeneous or homogeneous in functionality. Additionally, the dies comprising both the stack may also be heterogeneous or homogeneous in functionality. The one example, chip package includes logic stack that has a dummy die stacked with a logic die. The dummy die is utilized to reduce or even eliminate a height differential between a memory stack and the logic stack that are co-packaged into a memory device. In one example, the memory stack is a high bandwidth memory (HBM) stack and the memory device is a high bandwidth memory (HBM) device As the height differential between the HBM stack and a logic/dummy die stack is substantially the same, thermal management of the chip package is improved over conventional packages having mismatched stack heights. The enhanced thermal management as compared to conventional HBM devices advantageously enables more reliable and robust performance.

In a conventional HBM devices, manufacturing constraints generally limit the overall height of the HBM stack is generally limited to the 775 µm, which is the standard thickness of a 300 mm diameter wafer. This height limitation limits the amount of memory dies that may be utilized within the HBM stack as taller stacks are not compatible with conventional processing and fabrication equipment. Today, most HBM devices are limited to about 12-16 memory dies within a single HBM stack. Additionally as described above, mismatch between the HBM stack and the adjacent logic die creates a poor heat transfer interface at the top of the conventional HBM package, which is detrimental to performance and device reliability.

In contrast, the chip packages described herein are not constrained by the 775 µm height limitation, and as such, the number of memory dies within the HBM stack may advantageously exceed 16 memory dies within a single HBM stack. Additionally, the substantially similar height of the HBM and logic/dummy die stacks improves the ability of the chip package to be handled by automated factory equipment, which in turn reduces the potential for damage, enhances manufacturing through-put and reduces product costs.

Although the above referenced innovative technology is described herein utilizing a stack of memory dies and an adjacent logic die, any two or more die stacks made to have substantially equal heights through the use of a thinned dummy die that is part of one of the stacks is included within the scope of the disclosure described herein.

Figure 1B:
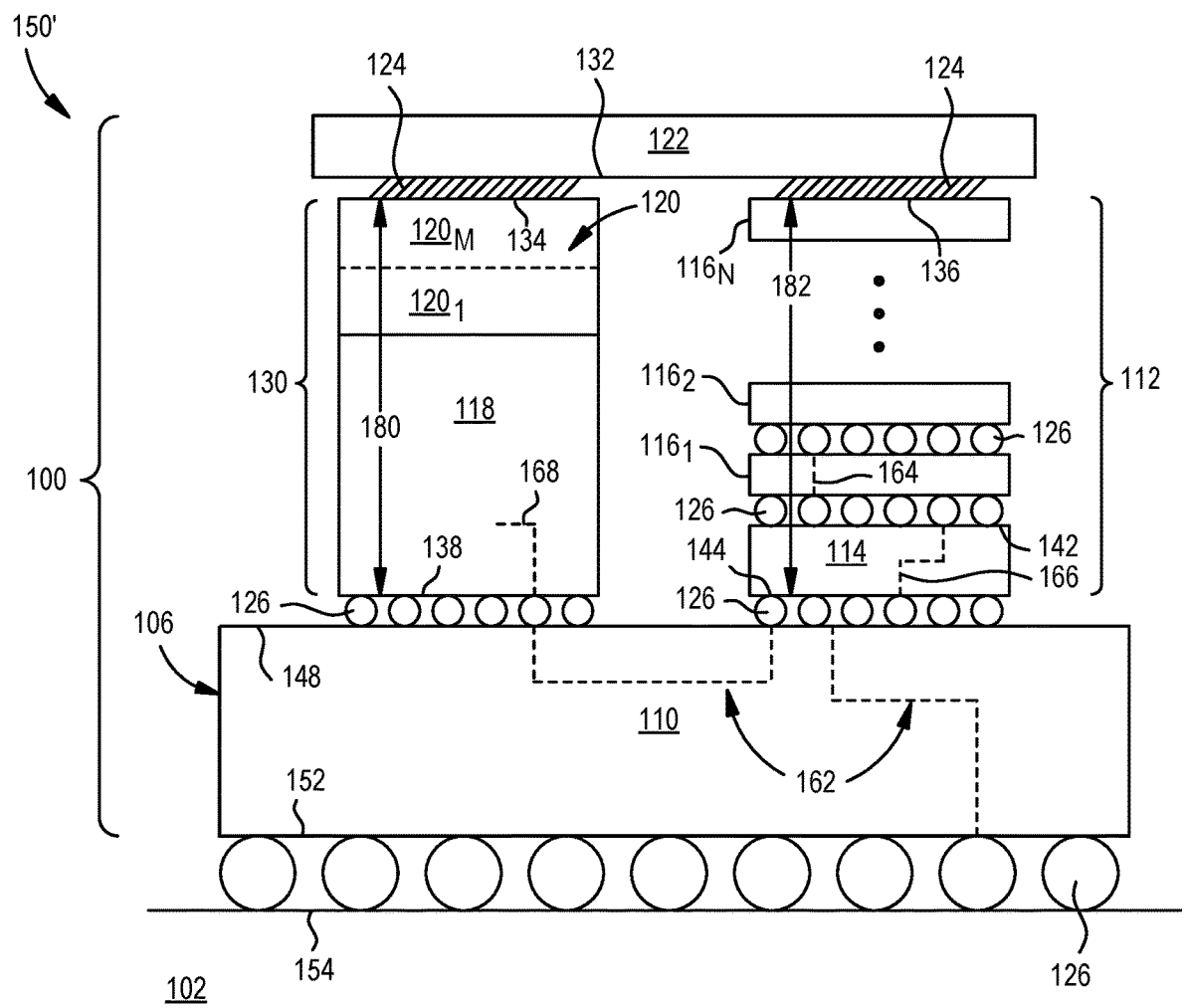
FIGS. 1B-C are a schematic front views of alternative variations of an integrated circuit chip package mounted on a printed circuit board.
Figure 1C:
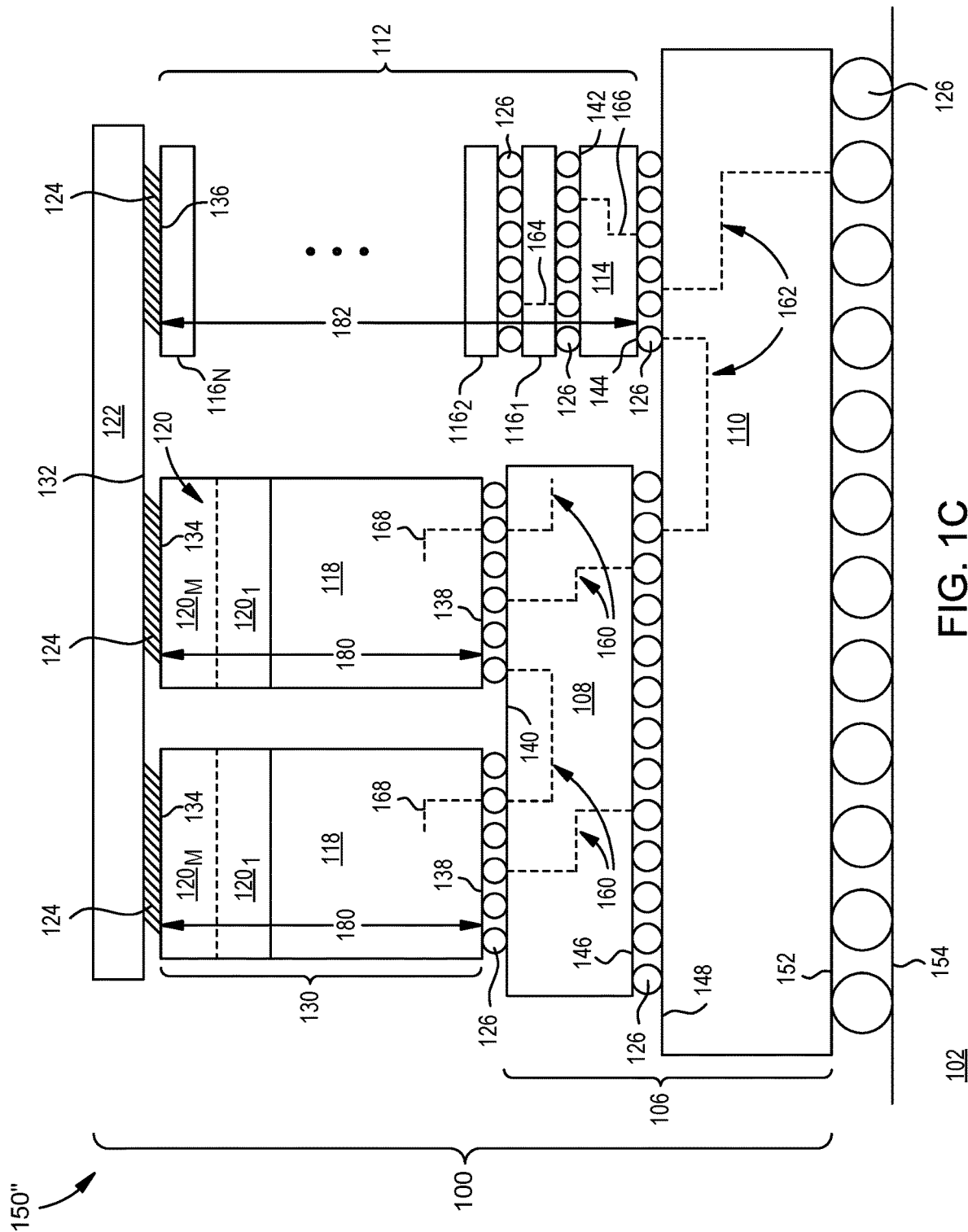

Turning now to FIG. 1A, an integrated circuit electronic device 150 is schematically illustrated having an exemplary integrated circuit chip package 100 mounted on a printed circuit board (PCB) 102. The chip package 100 is configured as a memory device, such as a high bandwidth memory (HBM) device or other memory device. However, the chip package 100 may alternatively configured as another type of electronic device that includes two die stacks, wherein one of the die stacks includes a dummy die for creating substantially equal stack heights with a second of the die stacks. The chip package 100 includes a substrate 104 upon which one or more first die stacks 130 and one or more second die stacks 112 are mounted. The first die stack 130 includes one or more functional dies 118 and one or more dummy dies 120. The second stack 112 includes one or more functional dies 116. The functional dies 116, 118 may be a logic die, a memory die or other type of die containing functional circuitry. In the example depicted FIG. 1, the first die stack 130 is hereinafter referred as a logic stack 130 and the second die stack 112 is herein after referred to as a memory stack. The logic stack 130 includes a logic die 118 and one or more dummy dies 120. The memory stack 112 includes a plurality of serially stacked memory dies $116_N$, were N is a positive integer. The memory stack 112 may also include a buffer die 114 upon which the plurality of memory dies $116_N$ are mounted. A molding compound (later shown in FIG. 5) is disposed around the die stacks to maintain the positional orientation and spacing of the dies within each stack 112, 130.

In the example depicted in FIG. 1A, the substrate 104 upon which the logic stack 130 and the memory stack 112 are mounted is configured as an interposer substrate 108. The interposer substrate 108 is mounted to a package substrate 110. A bottom 152 of the package substrate 110 is mounted to a top surface 154 of the PCB 102 to form the electronic device 150.

In another example, the chip package 100 does not include an interposer substrate 108, and the substrate 104 upon with the logic stack 130 and one or more memory stacks 112 are mounted is configured as a package substrate 110. The package substrate 110 is mounted to the PCB 102 to form the electronic device 150 (as shown as the electronic device 150' in FIG. 1B).

In another example, the chip package 100 includes one of the one or more logic stacks 130 or one of the one or more memory stacks 112 mounted to the interposer substrate 108, and with the other of the one or more logic stacks 130 or one or more memory stacks 112 mounted to the package substrate 110. The package substrate 110 is mounted to the PCB 102 to form the electronic device 150 (as shown as the electronic device 150" in FIG. 1C) In the example of FIG. 1C, a plurality, for example two, logic stacks 130 are mounted to the interposer substrate 108 while a memory stack 112 is mounted to the package substrate 110.

Returning to FIG. 1A and as discussed above, the memory stack 112 includes a plurality of stacked memory dies $116_N$. The memory dies $116_N$ are mechanically and electrically connected using solder connections 126, such as for example using solder micro-bumps. In the example depicted in FIG. 1A, although the memory dies $116_N$ are illustrated in a single stack, the package 100 may include more or more stacks of memory dies $116_N$. The stack of memory dies $116_N$ may include different numbers of dies $116_N$. In some examples, the number of memory dies $116_N$ in a memory stack 112 may be 12, 16, 20, 24, 32 or other desired number of dies $116_N$. Each of the memory dies $116_N$ are configured as a high-performance solid state memory device, such as DRAM, among others.

The memory die $116_1$ closest the interposer substrate 108 is disposed on the buffer die 114 of the memory stack 112. The memory die $116_1$ is mechanically and electrically connected to the buffer die 114 using solder connections 126, such as for example using solder micro-bumps. The buffer die 114 generally manages the communication with and between the memory dies $116_N$ of the memory stack 112. The buffer die 114 also functions as an I/O die, interfacing the memory dies $116_N$ with the interposer substrate 108, so that the logic die 118 of the logic stack 130 can quickly and efficiently communicate with the memory dies $116_N$.

The bottom most die in the memory stack 112, such as the buffer die 114 illustrated in FIG. 1A, is mounted to the interposer substrate 108 utilizing solder connections 126. The solder connections 126 couple the circuitry 166 of the buffer die 114 to the circuitry 160 of the interposer substrate 108. Solder connections 126 are disposed between buffer die 114 and the memory die $116_1$ to connect the couple the circuitry 166 of the buffer die 114 to the circuitry 164 of the memory die $116_1$. Solder connections 126 are also disposed between the memory dies $116_{1-N}$ to connect the couple the circuitry 164 of the memory dies $116_{1-N}$, and ultimately to the the circuitry 160 of the interposer substrate 108.

Similarly, the interposer substrate 108 is mounted to the package substrate 110 utilizing solder connections 126. The solder connections 126 couple the circuitry 162 of the package substrate 110 to the circuitry 160 of the interposer substrate 108. Solder connections 126 are also utilized to mechanically and electrically connect the circuitry 162 of the package substrate 110 to the circuitry of the PCB 102.

Thus, the circuitry of the PCB 102 is coupled through the chip package 100 to the circuitry 164 of the memory dies $116_n$, and the circuitry 168 of the logic die 118.

The memory stack 112 has a bottom 144 and a top surface 136. In the illustration of FIG. 1A, the bottom 144 of the memory stack 112 is also the bottom 144 of the buffer die 114. Similarly, the top surface 136 of the memory stack 112 is also the top surface 136 of the uppermost die $116_N$ of the memory stack 112 that is furthest from the interposer substrate 108. A height 182 is defined between the top surface 136 and the bottom 144 of the memory stack 112 and is illustrated in FIG. 1A. The height 182 may be greater than 775 µm, and in some embodiments, the height 182 is greater than 775 µm.

As discussed above, the logic stack 130 includes at least one logic die 118 and at least one dummy die 120. Multiple dummy dies 120 are schematically illustrated by a dashed line separating dummy die $120_1$ from dummy die $120_M$, where M is representative of one or more dummy dies. The logic die 118 may be programmable logic device, such as a field programmable gate array (FPGA), a graphics processing unit (GPU), an application-specific integrated circuit (ASIC), a system on a chip (SoC), processors or other IC logic structure. The logic die 118 functions as a controller for the memory dies $116_N$ of the memory stack 112. In the example depicted in FIG. 1A, the chip package 100 is configured with at least one logic die 118 of the logic stack 130 in the form of an FPGA co-packaged with a high bandwidth memory (HBM) device having at least one memory stack 112 of memory dies $116_N$, such as DRAM.

Returning to the description of the dummy die 120, the dummy die 120 may be a silicon die fabricated from a semiconductor wafer or other suitable material. Alternatively, the dummy die 120 may be fabricated from other dielectric material or sources. The dummy die 120 may be bonded or otherwise adhered to the logic die 118. In one example, the dummy die 120 is bonded to the logic die 118 utilizing a layer of silicon oxide. The layer of oxide may be grown, deposited or otherwise formed on the outer surface of one or both of the dummy or the logic dies 120, 118. In one example, the layer of oxide is silicon oxide. The layer of oxide bonds the dummy die 120 to the logic die 118 through the application of heat while pressing the dies 118, 120 together.

When multiple dummy dies 120 are utilized, the additional dummy dies 120 may be stacked on the dummy die 120 that is bonded to the logic die 118. The dummy dies 120 may be bonded or otherwise adhered together in any suitable manner. In one example, the dummy dies 120 are bonded together utilizing a layer of silicon oxide.

The logic stack 130 has a bottom 138 and a top surface 134. In the illustration of FIG. 1A, the bottom 138 of the logic stack 130 is also the bottom 138 of the logic die 118. Similarly, the top surface 134 of the logic stack 130 is also the top surface 134 of the dummy die 120 when a single dummy die 120 is present in the logic stack 130. When multiple dummy dies 120 are utilized, the top surface 134 of the logic stack 130 is also the top surface 134 of the uppermost dummy die 120 that is furthest from the interposer substrate 108. A height 180 is defined between the top surface 134 and the bottom 138 of the logic stack 130 and is illustrated in FIG. 1A. The height 180 is generally greater than 775 µm. The height 180 of the logic stack 130 is also substantially the same as the height 182 of the memory stack 112. As utilized herein, the heights 180, 182 are "substantially the same" when the heights 180, 182 are within about 10 mm of each other, resulting in the top surfaces 134, 136 being "substantially coplanar". Having the heights 180, 182 substantially equal advantageously provides a number of benefits, one of which is enhancing the thermal management of the logic and memory stacks 130, 112, as further described below.

In one example, the height 180 may be selected to substantially equal the height 182 of the memory stack 112 by thinning at least one dummy die 120 of the logic stack 130. In examples when multiple dummy dies 120 are utilized, at least one of the dummy dies 120 comprising the logic stack 130 is thinned, while one or more other dummy dies 120 comprising the logic stack 130 may or may not be thinned. In other examples, two or more, or even all, of the dummy dies 120 comprising the logic stack 130 are thinned. In examples wherein a single dummy die 120 is utilized, at least one or both of the dummy die 120 and logic die 118 comprising the logic stack 130 is or are thinned. The dummy or logic die 120, 118 may be thinned by etching, milling, grinding, polishing, machining or other suitable technique. In an alternative example, the heights 180, 182 are substantially equal without thinning the dummy die 120 of the logic stack 130.

A cover 122 is disposed on the logic and memory stacks 130, 112. The cover 122 may optionally be coupled to the interposer substrate 108, for example, utilizing a stiffener not shown. The cover 122 may be fabricated from a dielectric or conductive material. In the example depicted in FIG. 1A, the cover 122 is fabricated from a conductive material and functions as a heat sink for dies 118, $116_N$, 114 of the chip package 100. The cover 122 may optionally include fins for enhancing heat transfer or have a separate heat sink disposed thereon.

Thermal interface material (TIM) 124 is disposed between the cover 122 the logic and memory stacks 130, 112 to enhance heat transfer therebetween. In one example, the TIM 124 may be a thermal polymer adhesive, a thermally conductive film, a thermally conductive liquid, thermal gel or thermal epoxy. Since the heights 182, 180 of the memory and logic stacks 112, 130 are substantially equal, the amount of TIM 124 utilized between the stacks 112, 130 and cover 122 may be controlled to promote good and uniform heat transfer therebetween. In conventional packages having mismatch heights, thick TIM disposed between the shorter stack and the cover has poor heat transfer which adversely affects performance and reliability. Thus, the chip package 100 having substantially equal memory and logic stack heights 182, 180 provide significantly improved thermal management as compared to conventional packages. Moreover, as the memory and logic stack heights 182, 180 are substantially equal thus substantially coplanar, the chip package 100 is more readily handled by automation equipment, thus reducing the cost and complexity of manufacture.

FIGS. 2-7 are schematic sectional views of an integrated circuit chip package 700 configured as a memory device during different stages of fabrication. The stages of fabrication illustrated in FIGS. 2-7 correspond to a method 800 for fabricating the chip package 700, an example of which is provided in the flow diagram illustrated in FIG. 8. The chip package 700 is configured to have at least two stacks of dies, such as at least one or more logic stacks 130 and as at least one or more memory stacks 112, disposed on a substrate 106. The chip package 700 may be utilized as the chip package 100 illustrated in FIG. 1A that is part of the electronic device 150.

Figure 2:
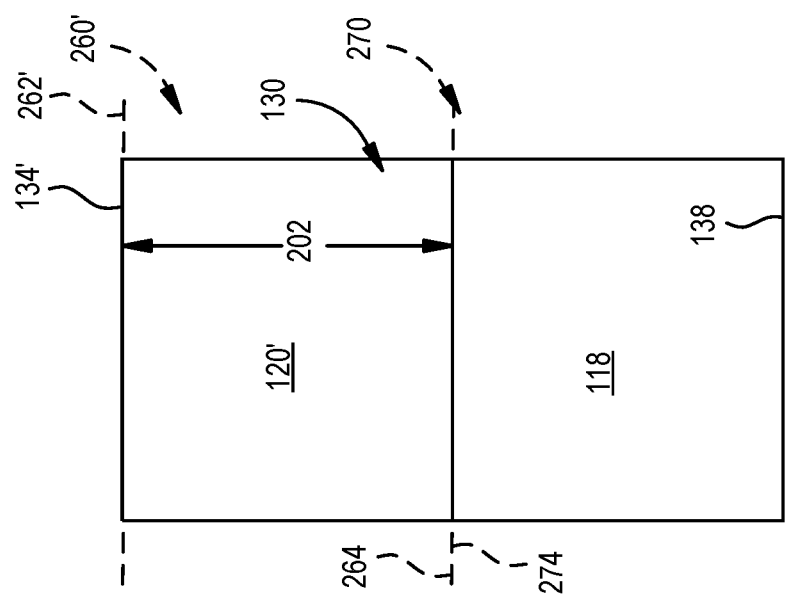

Referring now to FIGS. 2-8, the method 800 of fabricating the chip package 700 begins at operation 802 by stacking at least one dummy die 120' on a logic die 118 as illustrated in FIG. 2 to form a logic stack 130'. Although one dummy die 120' is illustrated in FIG. 2, two or more dummy dies 120' may be stacked on the logic die 118.

The dummy die 120' generally has a height 202 defined between a top surface 134' of the logic stack 130' and the interface between a top of the logic die 118 and a bottom of the dummy die 120'. In one example, the height 202 corresponds to a thickness of a wafer from which the dummy die 120' was diced. The dummy die 120' is secured to the logic die 118, for example by a bond or adhesive. In one example, the dummy die 120' is secured to the logic die 118 utilizing an oxide bond or other suitable technique.

Figure 3:
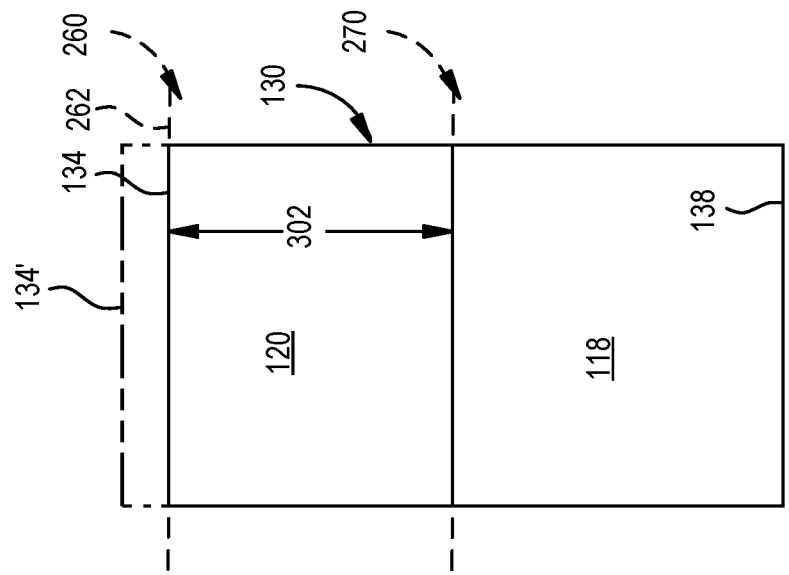

At operation 804 the dummy die 120' secured to the logic die 118 is thinned as illustrated in FIG. 3 to form a logic stack 130. The dummy die 120' may be thinned by removing material from the top surface 134' of the dummy die 120' to form a new top surface 134 that is closer to the bottom 138 of the logic die 118. The dummy die 120' may be thinned by etching, milling, grinding, polishing, machining or other suitable technique, to a height 302. The thinned dummy die is designated by reference numeral 120. The height 302 of the thinned dummy die 120 is defined between the new top surface 134 of the logic stack 130 the interface between a top of the logic die 118 and a bottom of the dummy die 120. As material has been removed from the top of the dummy die, the height 302 is less than the height 202. Although in the sequence described in FIG. 8 operation 802 occurs prior to operation 804, the dummy die 120' may alternatively be thinned prior to operation 802, with operation 804 being optionally performed after adhering the dummy die 120 to the logic die 118.

Although FIGS. 2-3 illustrate stacking and thinning being performed on separated dies, the dummy die 130 may alternatively be thinned while part of a wafer prior to dicing. Additionally, a wafer containing the dummy die 130 may be bonded to a wafer containing the logic die 118, which are later diced to form the logic stack 130 (which may be thinned prior to, or after, dicing). For example, although the dies 118, 120' are illustrated in FIGS. 2-3 as individual dies, the dummy die 120 may be part of a dummy wafer 260 (shown in phantom) comprising a plurality of dummy dies 120', while the logic die 118 is part of a wafer 270 (shown in phantom) comprising a plurality of logic dies 118, which may be later diced to form a plurality of individual logic stacks 130. In this example, the top surface 134' of the dummy die 120' is also a top surface 262' of the dummy wafer 260. A bottom surface 264 of the dummy wafer 260' is secured to a top surface 274 of the wafer 270 comprising the logic dies 118, for example by a bond or adhesive. The dummy wafer 260' is secured to the wafer 270 utilizing an oxide bond or other suitable technique. Although a single dummy wafer 260' is shown in phantom stacked on the wafer 270 in FIGS. 2-3, it is contemplated that the dummy wafer 260' is illustrative of a plurality of stacked dummy wafers 260. The dummy wafer 260' secured to the wafer 270 is thinned and separated, or alternatively separated and thinned, to form a plurality of logic stacks 130. The dummy wafer 260' may be thinned by removing material from the top surface 262' of the dummy wafer 260' to form a new top surface 262 that is closer to the bottom 138 of the logic die 118. The dummy wafer 260' is thinned as discussed above until the thinned dummy die 120 reaches the height 302. The thinned dummy die is designated by reference numeral 260.

At operation 806, the thinned logic stack 130 and a memory stack 112 are mounted to a substrate 106, as shown in FIG. 4. Although the substrate 106 shown in FIG. 4 is configured as an interposer substrate 108, the stacks 112, 130 may optionally be mounted to a substrate 106 configured as a package substrate 110 as discussed with reference to FIG. 1A. At operation 806, solder connections 126 between the interposer substrate 108 and the stacks 112, 130 are made to electrically and mechanically connect the circuitry 160 of the interposer substrate 108 to the circuitry 164, 166, 168 residing in the stacks 112, 130.

Figure 5:
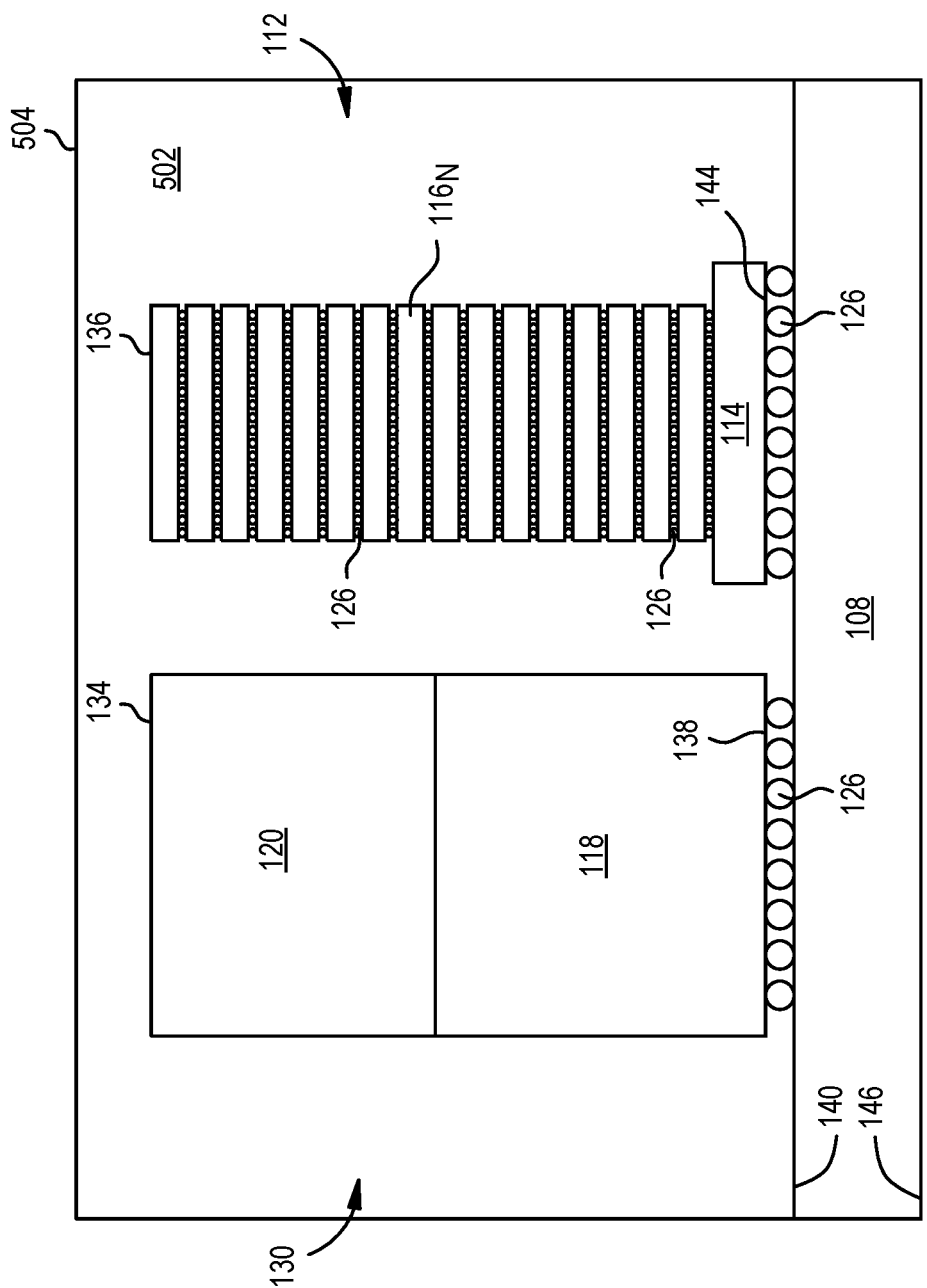

At operation 808, a molding compound 502 is disposed on the top surface 140 of the interposer substrate 108 to encapsulate the stacks 112, 130 as illustrated in FIG. 5. The molding compound 502 has a top surface 504 that extends beyond the top surfaces 134, 136 of the stacks 112, 130. The molding compound 502 is generally a dielectric material, such as an epoxy or high temperature polymer.

Figure 6:
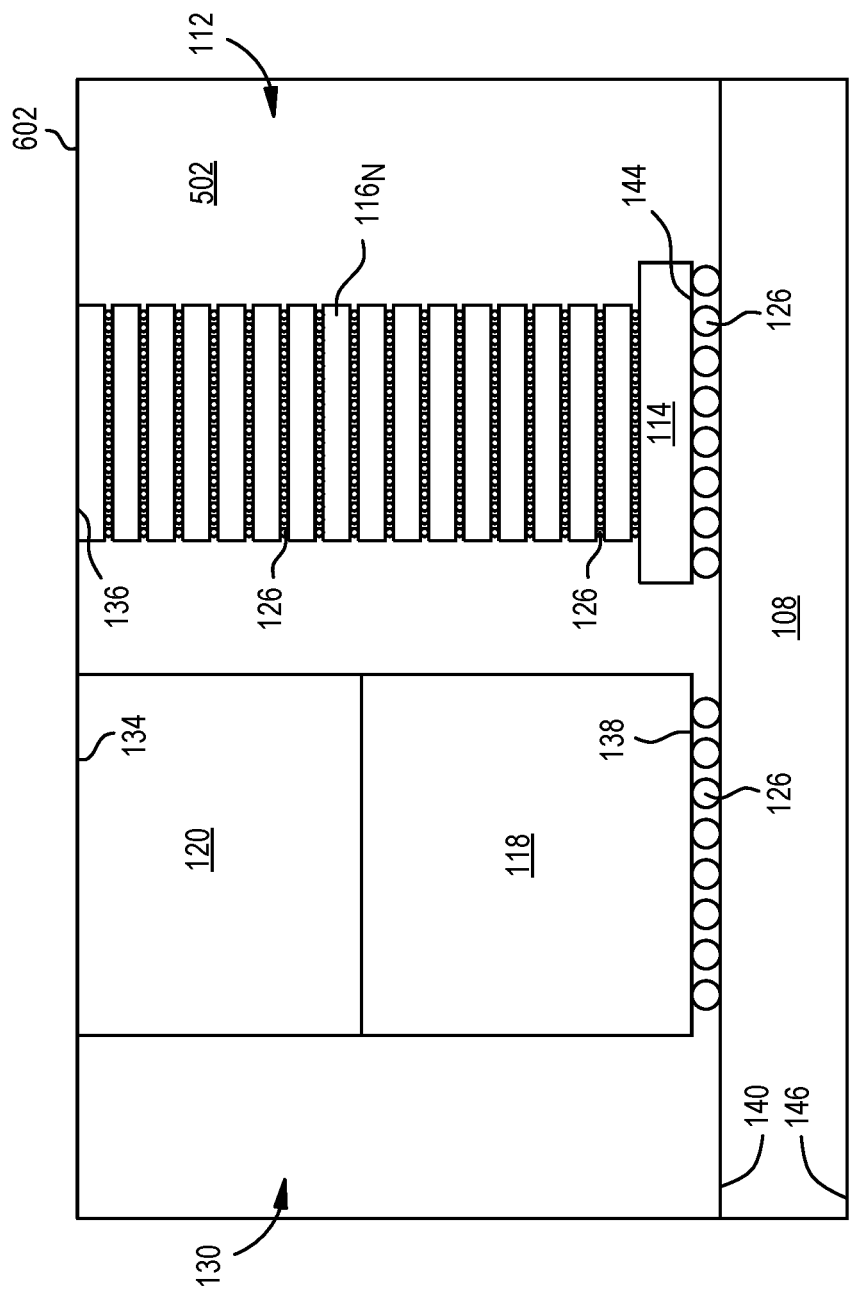

At operation 810, material is removed from the top surface 504 of molding compound 502 so that a new top surface 602 of the molding compound 502 is substantially coplanar with the top surfaces 134, 136 of the stacks 112, 130, as illustrated in FIG. 6. The top surface 504 of molding compound 502 may be removed by etching, milling, grinding, polishing, machining or other suitable technique.

Figure 7:
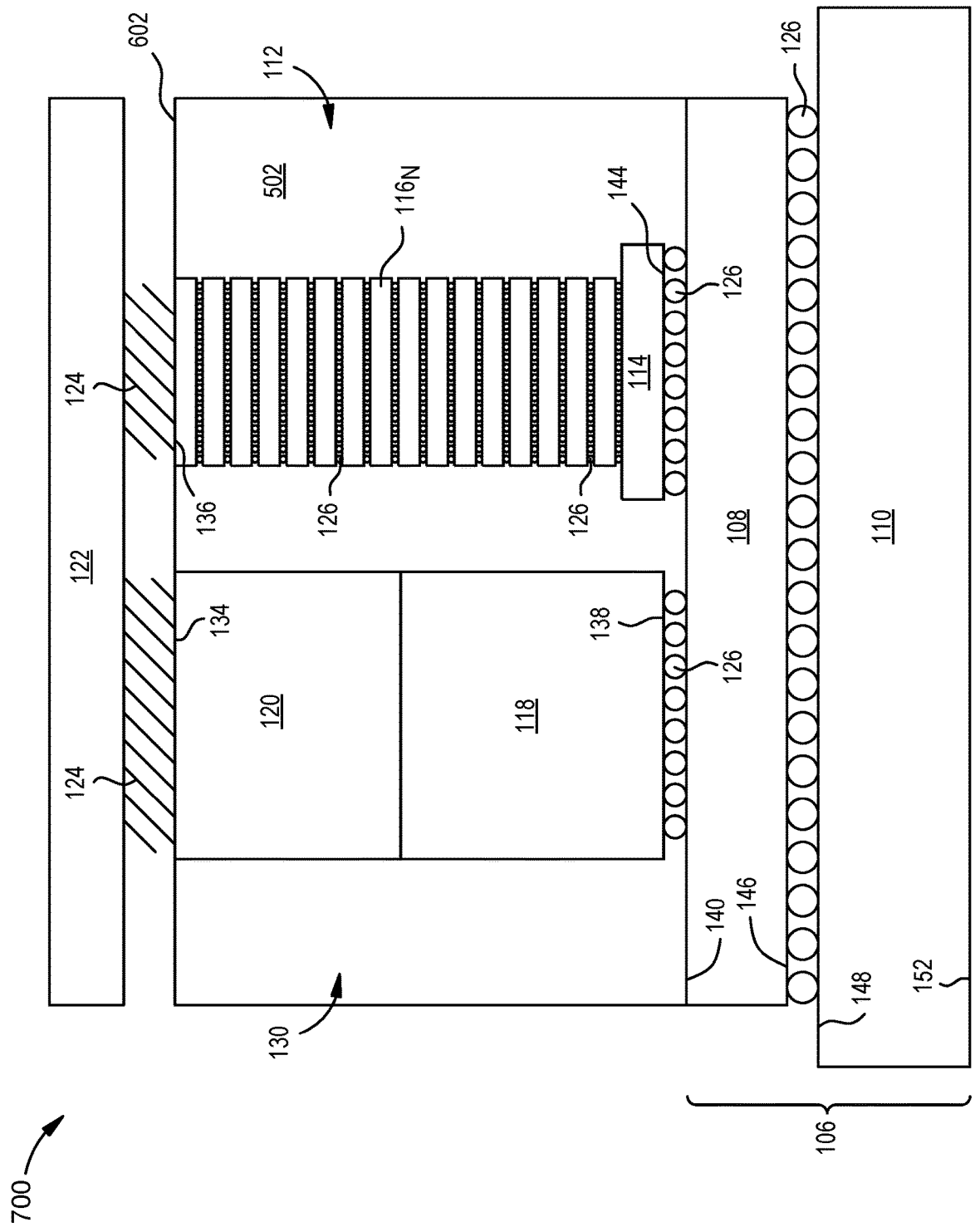
Figure 8:
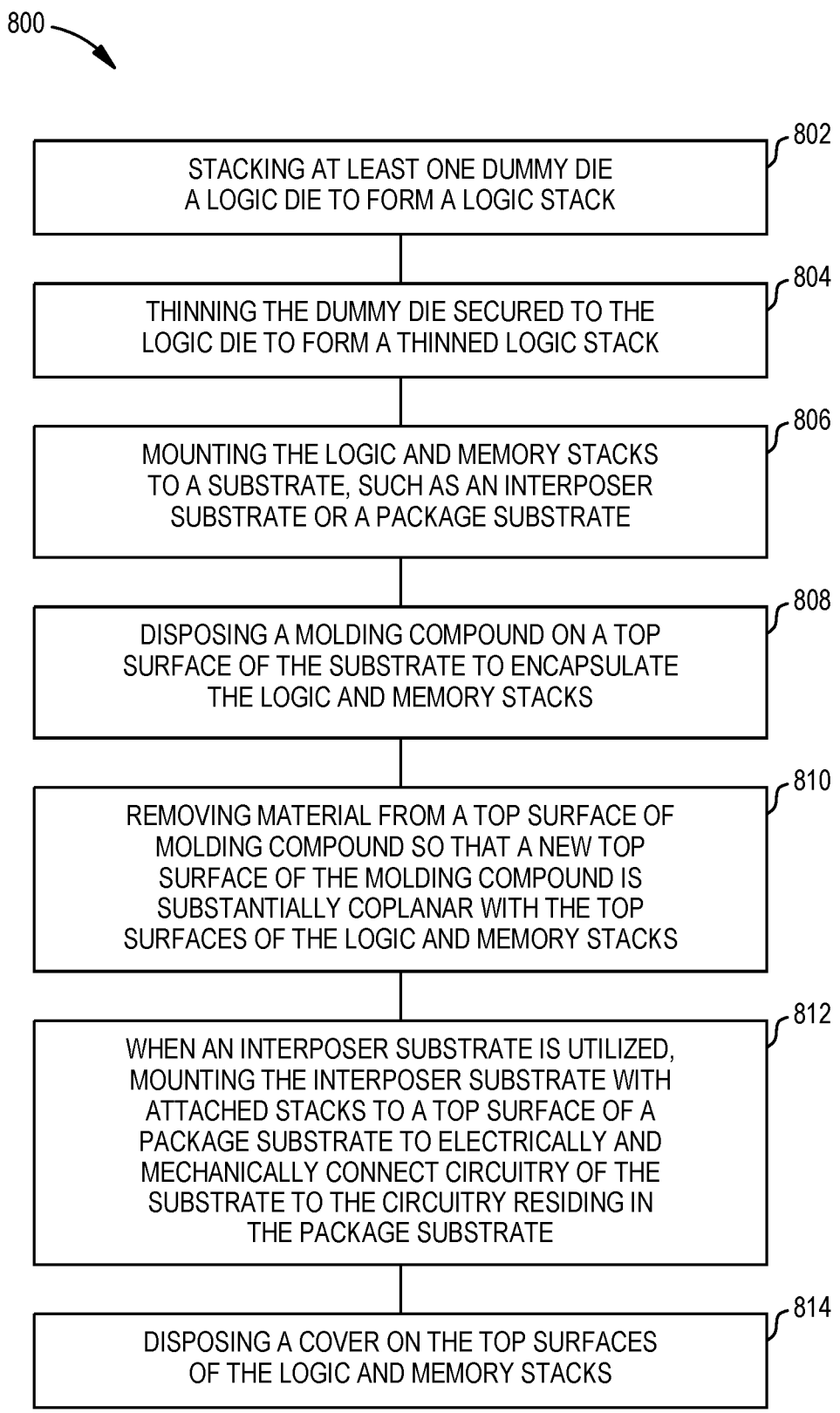
FIG. 8 is a flow diagram of a method of fabricating a chip package corresponding to the stages of fabrication depicted in FIGS. 2-7.

At operation 812 when an interposer is utilized, the interposer substrate 108 with attached stacks 112, 130 is mounted to a top surface 148 of a package substrate 110, as illustrated in FIG. 7. At operation 812, solder connections 126 between the interposer substrate 108 and the package substrate 110 are made to electrically and mechanically connect the circuitry 160 of the interposer substrate 108 to the circuitry 162 residing in the package substrate 110.

At operation 814 also illustrated in FIG. 7, a cover 122 is disposed on the top surfaces 134, 136 of the stacks 112, 130. TIM 124 is disposed between the cover 122 is disposed on the top surfaces 134, 136 of the stacks 112, 130 to enhance heat transfer from the dies of the stacks 112, 130 to the cover 122.

Thus, the chip packages and fabrication methods described herein substantially eliminate height differential between a memory and logic stacks that are co-packaged into a HBM or other memory device. The co-packaged memory and logic stacks have substantially the same heights, which enhances thermal management of the chip package over conventional packages having mismatched stack heights, thus enabling more reliable and robust performance. The chip packages described herein also are not constrained by the 775 μm height limitation of conventional chip packages, and as such, the number of memory dies within the memory stack may advantageously exceed 16 memory dies within a single memory stack. Additionally, the substantially similar height of the memory and logic stacks more effectively interfaces with factory automation, which advantageously increases product yield while driving down the cost of fabrication, and ultimately, the cost of the chip package.

While the foregoing is directed to embodiments of the present disclosure, other and further embodiments may be devised without departing from the basic scope thereof, and the scope thereof is determined by the claims that follow.

What is claimed is:

1. An electronic memory device comprising:
   a substrate;
   a first die stack mounted to the substrate, the first die stack comprising a first dummy die stacked on a first functional die; and
   a second die stack disposed adjacent to the first die stack, the second die stack comprising a plurality of serially stacked second functional dies, the first dummy die having a top surface that is substantially coplanar with a top surface of the second die stack, wherein a height of one of the plurality of serially stacked second functional dies is less than a height of the first functional die.

2. The electronic memory device of claim 1 further comprising:
an oxide bond securing the first dummy die to the first functional die.

3. The electronic memory device of claim 1, wherein the first dummy die is thinned.

4. The electronic memory device of claim 1, wherein the top surface of the second die stack extends more than 775 μm above the substrate.

5. The electronic memory device of claim 4, wherein the plurality of serially stacked second functional dies forming the second die stack comprises at least 12 memory dies.

6. The electronic memory device of claim 4, wherein the plurality of serially stacked second functional dies forming the second die stack comprises more than 16 memory dies.

7. The electronic memory device of claim 4, wherein the plurality of serially stacked second functional dies forming the second die stack comprises more than 20 memory dies.

8. The electronic memory device of claim 6 further comprising:
a second dummy die disposed between the first dummy die and the first functional die.

9. The electronic memory device of claim 8, wherein at least one of the first dummy die and the second dummy die is thinned.

10. The electronic memory device of claim 8, wherein one of the first dummy die and the second dummy die is thinned and the other of the first dummy die and the second dummy die is not thinned.

11. The electronic memory device of claim 6 further comprising:
a plurality of dummy dies disposed between the first dummy die and the first functional die.

12. The electronic memory device of claim 1 further comprising:
a cover disposed over and in thermally conductive contact with the top surface of the first dummy die and the top surface of the second die stack.

13. The electronic memory device of claim 1, wherein the substrate is an interposer substrate, and wherein the interposer substrate is mounted on a package substrate.

14. An electronic memory device comprising:
a package substrate;
an interposer substrate mounted on the package substrate;
a memory stack mounted on a top surface of the interposer substrate, the memory stack comprising a plurality of serially stacked memory dies; and
a logic stack mounted on the top surface of the interposer substrate, the logic stack comprising one or more dummy dies disposed on a logic die, at least a first dummy die of one or more dummy dies being thinned, the logic stack having a top surface that is substantially coplanar with a top surface of the memory stack, wherein the logic stack comprises a logic die having a height greater than one of the plurality of serially stacked memory dies.

15. The electronic memory device of claim 14, wherein the logic stack further comprises:
a second dummy die stacked on the first dummy die.

16. The electronic memory device of claim 14, wherein the plurality of serially stacked memory dies forming the memory stack comprises at least 16 memory dies.

17. A method for forming an electronic memory device, the method comprising:
mounting a first die stack to a substrate, the first die stack comprising a first dummy die disposed on a first functional die;
mounting second die stack to the substrate, the second die stack comprising a plurality of serially stacked second functional dies; and
thinning the first die stack to a height substantially the same a height of the second die stack.

18. The method of claim 17 further comprising:
encapsulating first and second die stacks in a molding compound; and
exposing the first and second die stacks through the molding compound, wherein the first functional die is a logic die, and the plurality of serially stacked second functional dies includes memory dies.

19. The method of claim 18 further comprising:
mounting a cover on the exposed first and second die stacks; and
mounting the substrate to a package substrate.

20. The method of claim 17, wherein the first die stack comprising:
a second dummy die serially stacked with the first dummy die.

* * * * *